United States Patent [19]
Osada et al.

[11] Patent Number: 6,066,916
[45] Date of Patent: May 23, 2000

[54] ELECTROLUMINESCENT MATRIX DISPLAY DEVICE

[75] Inventors: Masahiko Osada, Hekinan; Hiroyuki Kishita, Kariya; Yutaka Hattori, Okazaki, all of Japan

[73] Assignee: Denso Corporation, Kariya, Japan

[21] Appl. No.: 08/914,657

[22] Filed: Aug. 19, 1997

[30] Foreign Application Priority Data

Aug. 19, 1996 [JP] Japan .................................. 8-217594

[51] Int. Cl.$^7$ ........................................................ H01J 1/62
[52] U.S. Cl. .......................... 313/505; 313/509; 313/504
[58] Field of Search .................................. 313/504, 505, 313/506, 509; 345/45, 76; 428/917; 427/66, 68; 315/169.3

[56] References Cited

U.S. PATENT DOCUMENTS 4,999,539  3/1991  Coovert et al. ........................ 313/505

FOREIGN PATENT DOCUMENTS

| | | |
|---|---|---|
| 61-256385 | 11/1986 | Japan . |
| 62-136698 | 6/1987 | Japan . |
| 63-6596 | 1/1988 | Japan . |
| 2-91618 | 3/1990 | Japan . |
| 3-107188 | 5/1991 | Japan . |
| 4-43995 | 10/1992 | Japan . |
| 6-132079 | 5/1994 | Japan . |
| 7-263140 | 10/1995 | Japan . |

Primary Examiner—Nimeshkumar D. Patel
Assistant Examiner—Todd Reed Hopper
Attorney, Agent, or Firm—Pillsbury Madison & Sutro LLP

[57] ABSTRACT

An electroluminescent matrix display device which displays images with uniform brightness on its panel having connecting terminals for both scanning and data electrodes formed on one side of the panel is disclosed. Scanning electrodes requiring larger current than data electrodes are formed vertically on the panel so that they can be connected directly to the terminals formed on the bottom side of the panel, and data electrodes are formed horizontally to be connected to the terminals at the bottom side through wiring leads. Since the wiring leads have different lengths and resistances from one another, the resistances are compensated or adjusted by changing widths of the wiring leads or adding compensating resistors thereto so that the wiring resistances become uniform or differences thereof are reduced. Running directions of the scanning and data electrodes may be exchanged. In this case, wiring resistance differences for the scanning electrodes are eliminated or reduced in a similar manner as done for the data electrodes. In both cases, uniformity of image brightness is much improved.

12 Claims, 8 Drawing Sheets

FIG. 2A

| (1, 1) | (1, 2) | | (1, 119) | (1, 120) |
|---|---|---|---|---|
| (2, 1) | (2, 2) | | (2, 119) | (2, 120) |
| | | | | |
| (119, 1) | (119, 2) | | (119, 119) | (119, 120) |
| (120, 1) | (120, 2) | | (120, 119) | (120, 120) |

FIG. 2B

| (1, 1) | (2, 1) | | (119, 1) | (120, 1) |
|---|---|---|---|---|
| (1, 2) | (2, 2) | | (119, 2) | (120, 2) |
| | | | | |
| (1, 119) | (2, 119) | | (119, 119) | (120, 119) |
| (1, 120) | (2, 120) | | (119, 120) | (120, 120) |

ELECTROLUMINESCENT MATRIX DISPLAY DEVICE

CROSS-REFERENCE TO RELATED APPLICATION

This application is based upon and claims benefit of priority of Japanese Patent Application No. Hei-8-217594 filed on Aug. 19, 1996, the content of which is incorporated herein by reference.

BACKGROUND OF THE INVENTION

1. Field of the Invention

The present invention relates to an electroluminescent (hereinafter referred to EL) display device in which images are displayed in a matrix fashion.

2. Description of Related Art

Conventionally, in an EL display device for displaying images in a matrix fashion, a data electrode array and a scanning electrode array are orthogonally arranged with each other to form a matrix on a glass substrate, sandwiching insulating layers and a luminescent layer between both arrays. Images are displayed with picture elements formed at each intersection of the data and scanning electrodes. Because the data electrode array and the scanning electrode array are arranged orthogonally with each other on a rectangular substrate, terminals for both electrode arrays are formed on two sides of the square substrate, respectively. These terminals for electrically connecting the electrodes to driver circuits are usually made of a metallic material. Therefore, regions on which the terminals are formed cannot be used for displaying images, and interfere with a viewer's sight if the terminals are formed on two sides of the substrate because the terminals have to be connected to the driver circuits. This is an obstacle in designing a display device.

With a purpose of solving the problem mentioned above, JP-A-7-263140 discloses an EL display device in which terminals for both data and scanning electrodes are formed on one side of a substrate by leading the scanning electrodes through a wiring lead portion to the side where the terminals are formed. However, there is another problem that a wiring resistance for each scanning electrode, when the electrode is made of a transparent conductive film such as ITO, cannot be made uniform because a lead wire length for each electrode is different from one another. The transparent ITO film which is readily available as a standard has a thickness of 0.2 $\mu$m and a sheet resistance of 10 $\Omega$ per square. Also, there is a thickness limit at this moment and it cannot be made thicker than 1 $\mu$m. In case this kind of ITO is used as transparent electrodes, its resistance will be more than 100 times higher than that of a metal such as aluminum. Accordingly, luminance uniformity of the display is adversely affected by the uneven wiring resistances of the scanning electrodes.

SUMMARY OF THE INVENTION

The present invention has been made in view of the above-mentioned problem, and an object of the present invention is to provide an EL matrix display device in which the terminals for both data and scanning electrodes are formed on one side of the rectangular substrate and unevenness of luminance is minimized.

In an electroluminescent matrix display device according to the present invention, scanning electrodes which require larger electric current than data electrodes are formed on a transparent substrate having a rectangular shape so that they run vertically from top to bottom and directly connect to scanning electrode terminals formed on a bottom side of the rectangular substrate. Data electrodes forming a matrix display area together with the scanning electrodes are formed on the substrate so that they run horizontally, that is perpendicularly to the scanning electrodes. Data electrodes are connected to data electrode terminals which are also formed on the same side as the scanning electrode terminals through wiring lead portions. Between the scanning and data electrodes, there are disposed thin transparent insulating layers which sandwich a transparent luminescent layer. Since both scanning and data electrodes and other layers are made of transparent material, an EL panel is transparent as a whole and the EL light can be emitted from both surfaces. At intersections of the scanning and data electrodes, picture elements displaying images in a matrix fashion are formed. The scanning and data electrodes connected to the terminals are driven by respective driver ICs.

Since the scanning electrodes are directly connected to the terminals and accordingly all have a same resistance. On the other hand, the data electrodes are connected to the terminals through wiring lead portions which have different lengths and resistances for each data electrode. Therefore, data electrodes have uneven wiring resistances. To reduce the unevenness of wiring resistance, this invention provides some measures. One is to reduce the wiring resistance itself by providing a more space for the wiring lead and widening the width of the wiring lead. For this purpose, the wiring leads may be connected to the data electrodes alternatively one by one from the right side or the left side. Another way is to connect a separate compensating resistor to each wiring lead of the data electrode, so that an overall wiring resistance for each data electrode becomes all equal. In this case, data electrodes or data terminals may be divided into a certain number of groups and compensating resistors having a same value may be connected to the data electrodes belonging to one group, and the resistance values may be changed from group to group. In this manner, a mask for manufacturing a resistor pattern will be simplified. The electroluminescent matrix display device thus made is able to display images having a uniform brightness or luminance.

It is also possible to arrange a display matrix in a conventional way, that is, forming the scanning electrodes horizontally and the data electrodes vertically, and to compensate wiring lead resistance of the scanning electrodes in a similar manner as mentioned above. In this case, the data electrodes are connected directly to the terminals formed on one side of the substrate while the scanning electrodes have to be connected to the terminals formed on the same side of the substrate through wiring leads. As the wiring leads have different lengths from one another and accordingly uneven resistances, the unevenness of the wiring resistances will be adjusted or reduced by changing width of wiring leads or adding compensating resistors. In this manner uniformity of images displayed on the EL panel will be much improved.

Other objects and features of the present invention will become more readily apparent from a better understanding of the preferred embodiments described below with reference to the following drawings.

BRIEF DESCRIPTION OF THE DRAWINGS

FIG. 2A shows positions of picture elements on an coordinate of a display panel in which a scanning electrode array is formed horizontally;

FIG. 2B shows positions of picture elements on an coordinate of a display panel in the first embodiment;

DETAILED DESCRIPTION OF THE PREFERRED EMBODIMENTS

Figure 1:
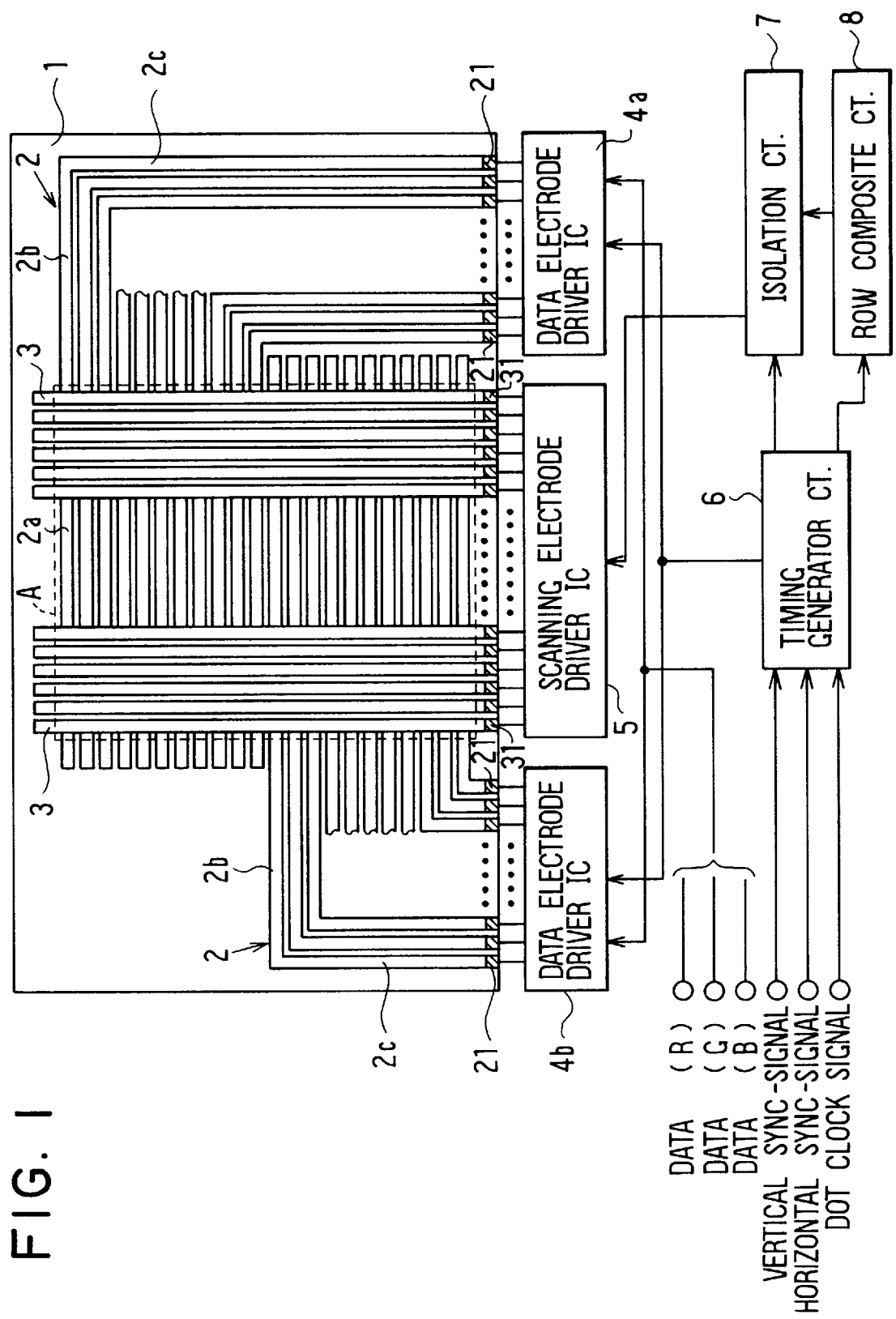
FIG. 1 shows a whole structure of an EL display device as a first embodiment according to the present invention.

Referring to FIGS. 1, 2A and 2B, a first embodiment according to the present invention will be described. In FIG. 1, a data electrode array 2 consisting of a plurality of data electrodes, each electrode being in a stripe shape with a uniform width, is formed horizontally on a rectangular glass substrate 1. On the data electrode array 2, a first insulating layer, a luminescent layer and a second insulating layer (not shown in the drawing) are formed in this order. Further, on those layers a scanning electrode array 3 consisting of a plurality of scanning electrodes, each electrode being in a stripe shape with a uniform width, is formed vertically. Both data and scanning electrode arrays are made of transparent conductive film, and the first and second insulating layers and the luminescent layer are also made of a transparent material. Therefore, the EL panel is transparent to both surfaces, front and back, and accordingly light can be emitted from either surface. An area encompassed by a dotted line A is a display area where the data electrodes and the scanning electrodes are orthogonally arranged, forming picture elements at each intersection. Images are displayed with these picture elements in a matrix fashion.

Terminals 21 for data electrode array 2 and terminals 31 for scanning electrode array 3 are formed on a bottom side of the rectangular substrate 1. Each data electrode is composed of an electrode 2a which is in the display area, a first wiring lead portion 2b extending horizontally from the electrode 2a, and a second wiring lead portion 2c extending vertically from the first wiring lead portion 2b and connected to the data electrode terminal 21. The wiring lead portions 2b and 2c for an upper half of the data electrode array 2 are formed at the right side of the panel, and the wiring lead portions for a lower half are formed at the left side. The electrode terminals 21 corresponding to the upper half of the data electrode array 2 are connected to a data electrode driver-IC (integrated circuit) 4a, while the electrode terminals 21 corresponding to a lower half of the data electrode array 2 are connected to a data electrode driver-IC 4b.

The electrode terminals 31 for the scanning electrode array 3 are connected to a scanning electrode diver-IC 5. The scanning electrode array 3 runs straight vertically without having wiring lead portion.

An image signal fed into the EL display device is composed of three data signals corresponding to R (red), G (green) and B (blue), respectively, and control signals including a horizontal synchronizing signal, a vertical synchronizing signal and a dot clock signal.

Referring to FIGS. 2A and 2B, positions of picture elements on the display panel will be explained. In a usual matrix display, the scanning electrodes 3 are arranged in the horizontal direction while the data electrodes 2 are arranged in the vertical direction. Assuming that the picture elements are composed of 120×120 elements, elements (1, 1), (1, 2), . . . (1, 120) are formed on the first horizontal row of the panel, as shown in FIG. 2A. The picture elements on the first row are made luminous at the same time during one horizontal synchronizing period. Picture elements formed on the second row are made luminous during the next horizontal synchronizing period, and all the rows up to the last are scanned in the same manner. As opposed to this, in the present embodiment, the scanning electrodes run vertically. Therefore, if the picture elements are scanned in the usual manner, images on the panel will be displayed with 90° rotated. In order to display images in a normal direction in the present embodiment, the data electrode driver-ICs 4a and 4b of this embodiment are designed so that signal outputs therefrom are arranged in the coordinate of the display panel as shown in FIG. 2B.

A timing generator circuit 6 outputs latch signals necessary to control the data electrode driver-ICs 4a and 4b and the scanning electrode IC based on the horizontal synchronizing signals, vertical synchronizing signals and the dot clock signals. A row composite circuit 8 outputs row composite signals based on signals from the timing generator circuit 6, and an isolation circuit 7 superimposes the row composite signals from the row composite circuit 8 and the latch signals from the timing generator circuit 6 and delivers the superimposed signals to the scanning electrode driver-IC 5. The scanning electrode driver IC 5 imposes a scanning voltage sequentially to the scanning electrodes 3, and the data electrode driver ICs 4a and 4b impose data signals on each data electrode 2.

The scanning electrodes tend to cause more wiring delay compared with the data electrodes, because all the intersections with the data electrodes are electric loads of the scanning electrodes. Therefore, it is more advantageous to arrange the scanning electrodes so that they can be directly connected to the electrode terminals 31 without going through wiring lead portions than to arrange the data electrode in this manner, when both terminals 31 for the scanning electrode array 3 and terminals 21 for the data electrode array 2 are formed on one side of the substrate 1 as in the present embodiment. Because all the scanning electrodes in this embodiment have a same electrode length and accordingly a same wiring delay, luminance unevenness on the display panel is minimized.

Figure 3:
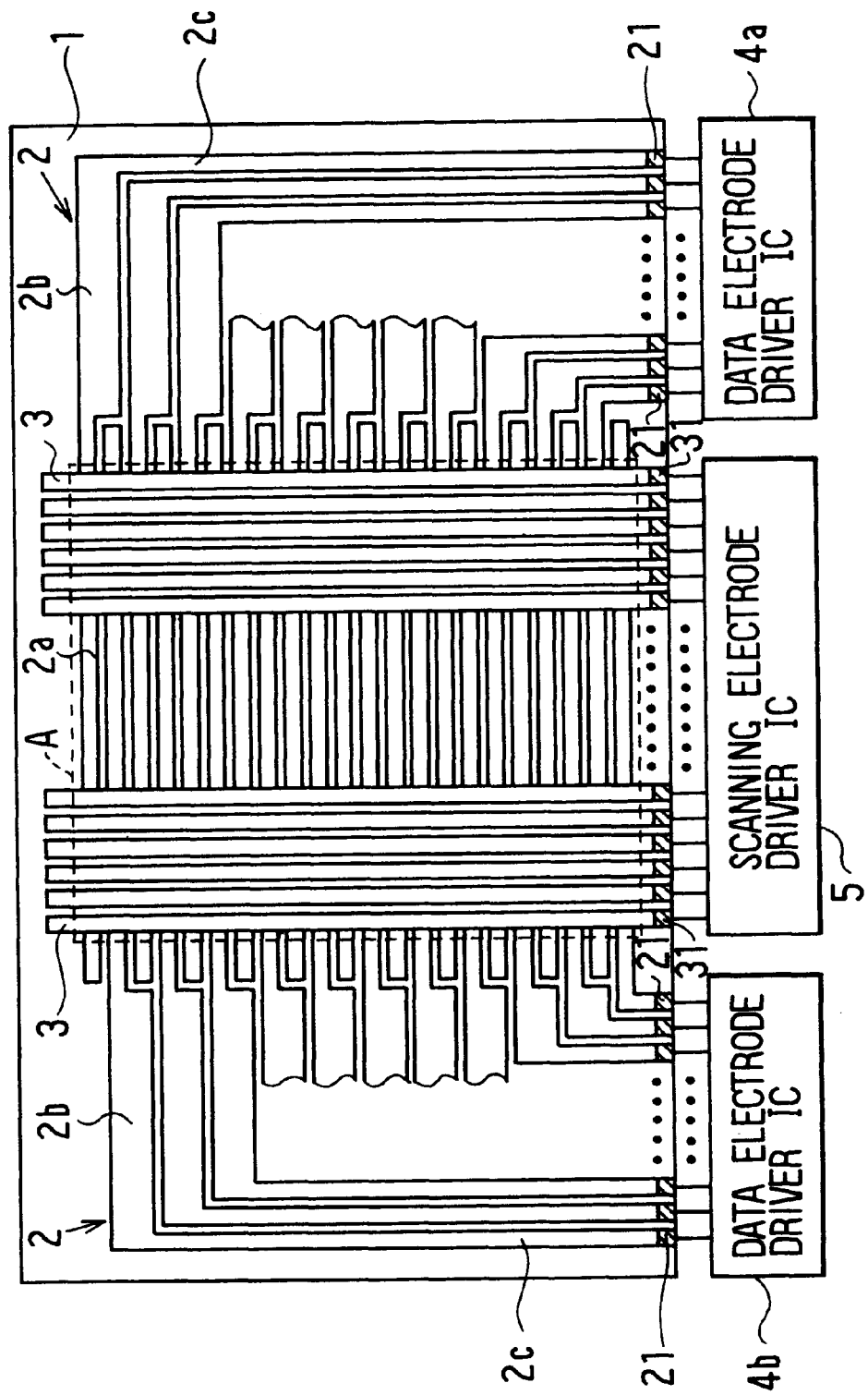
FIG. 3 shows a main structure of an EL display device as a second embodiment according to the present invention.

A main structure of a second embodiment according to the present invention is shown in FIG. 3. In this embodiment, wiring lead portions 2b and 2c of the data electrodes 2 are arranged differently from the first embodiment. That is, the first wiring lead portions 2b of the dada electrodes are formed alternately one by one to extend to the right side or to the left side of the substrate 1 as shown in FIG. 3. Because a wider space for each first wiring portion 2b is available in this arrangement, the first wiring lead portion 2b is made wider than that of the second wiring lead portion 2c. Thus, the wiring resistance for the data electrodes 2 can be made smaller, and accordingly differences among the wiring resistances of each data electrode also become smaller, resulting in further improvement of the luminance uniformity on the display panel.

Figure 4:
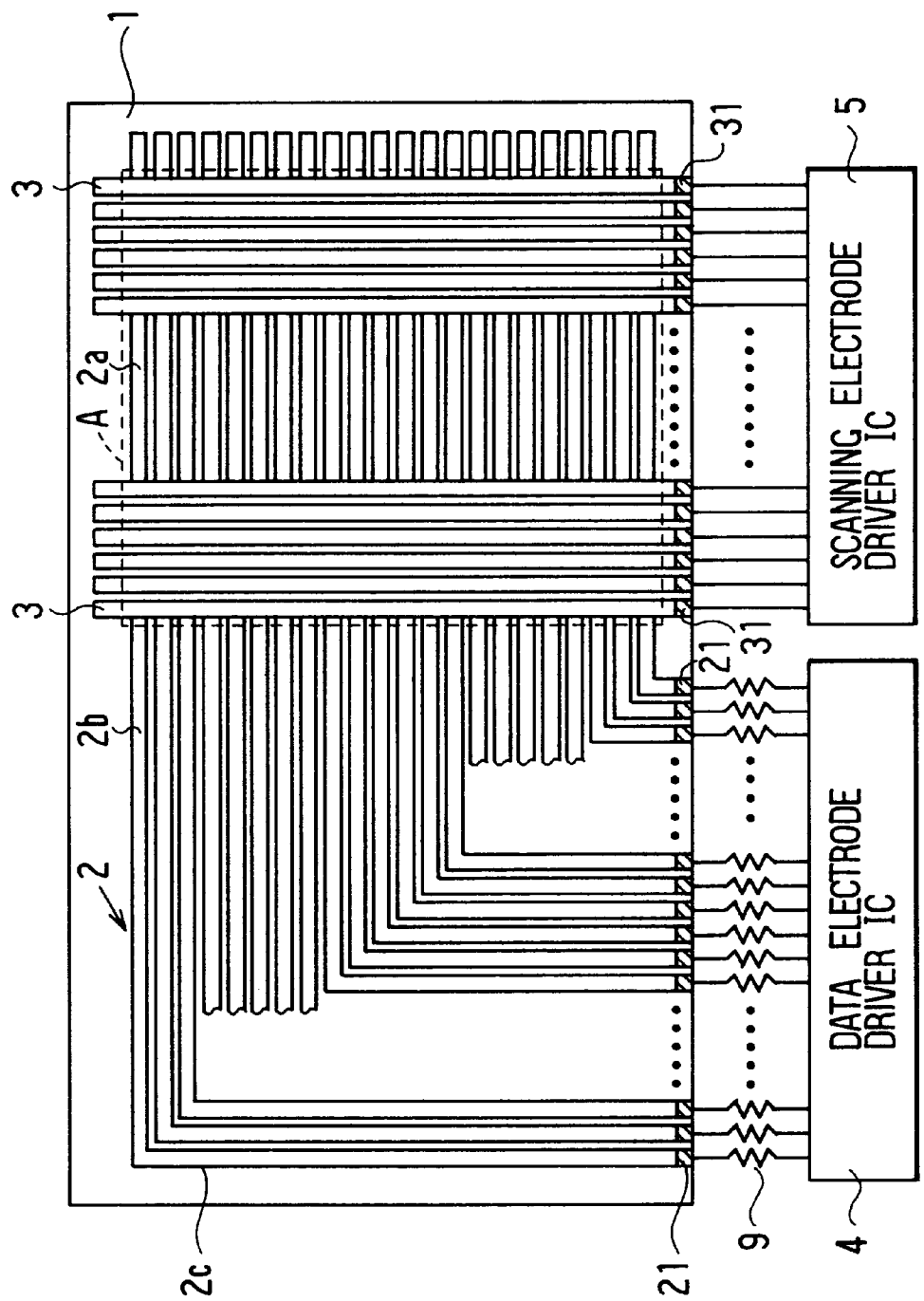
FIG. 4 shows a main structure of an EL display device as a third embodiment according to the present invention.

A main structure of a third embodiment according to the present invention is shown in FIG. 4. In this embodiment, the wiring lead portions 2c and 2b of the data electrodes 2 are formed on only one side of the substrate 1 (on the left side in the drawing) as opposed to the foregoing embodiments. In this arrangement, the wiring lead length for each data electrode is much different from one another (an electrode positioned at an upper portion has a higher wiring lead resistance). To compensate the difference of the wiring lead resistance, a compensating resistor 9 is connected to each data electrode terminal 21 in this embodiment as shown in FIG. 4. A value of each resistor 9 is selected so that a total wiring resistance including the wiring lead portions 2b and 2c and the resistor 9 for each data electrode becomes all equal. Thus, the luminance unevenness on the display panel caused by the difference in the wiring resistance of the data electrode can be eliminated.

Figure 5:
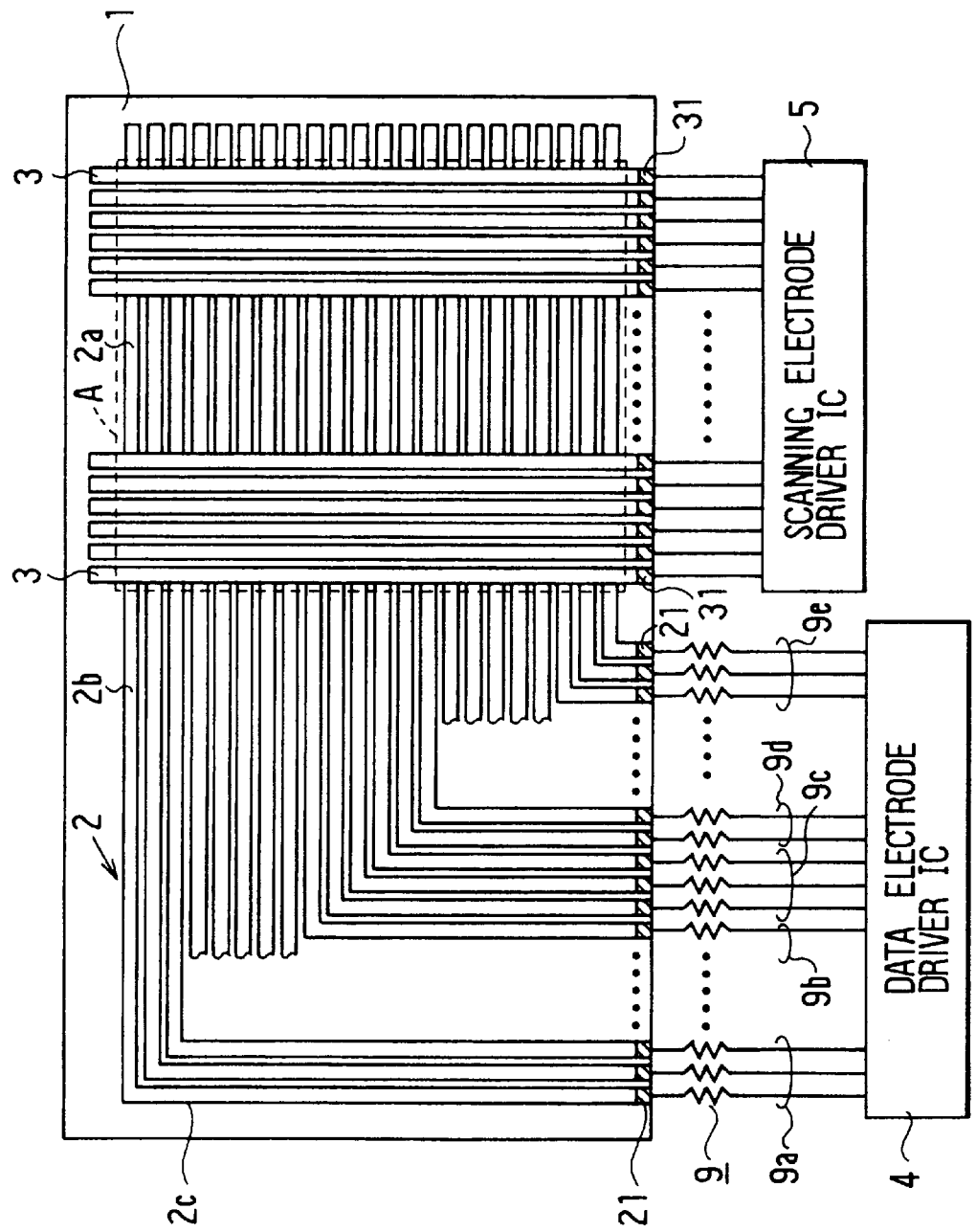
FIG. 5 shows a modified form of the third embodiment.

A modified form of the third embodiment is shown in FIG. 5. In this modification, the compensating resistors 9 are grouped in a certain number of groups, and the resistors 9 in a same group are made to have a same value. This is done to simplify a mask pattern for forming the compensating resistors. If an individual compensating resistor 9 has a different resistance value from one another, the mask pattern for forming the resistors 9 will be more complex. Preferably, the number of resistors 9 in one group is chosen to be in a range from 3 to 1/10 of the total number of the data electrodes, and more preferably in a range from 4 to 1/20 of the total number of the data electrodes. In the particular form shown in FIG. 5, the compensating resistors 9 are grouped into a group 9a, 9b, . . . 9e, so that there are three resistors in each group. The value of the resistor 9 for each group is chosen so that it changes evenly from group to group.

Figure 6:
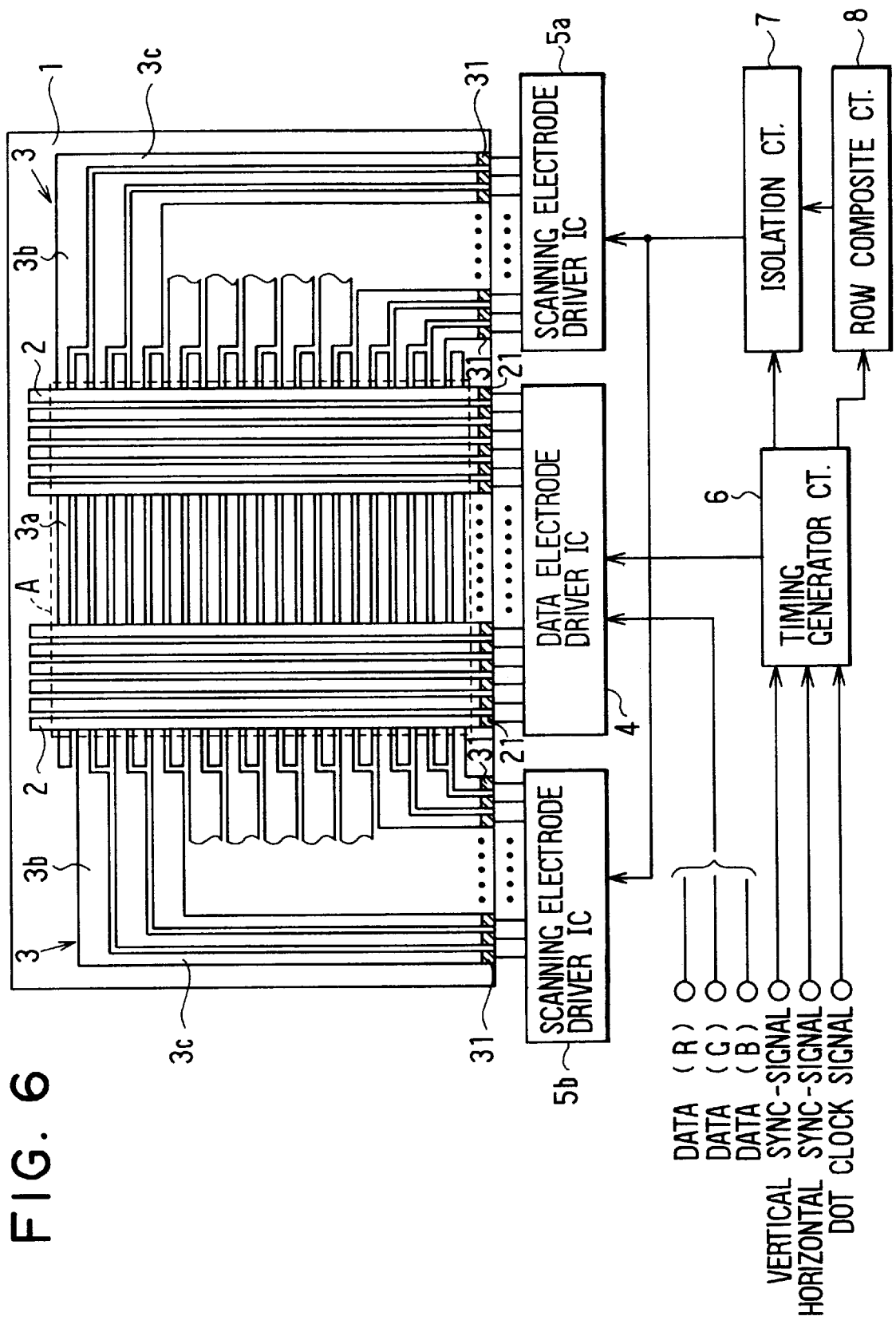
FIG. 6 shows a whole structure of an EL display device as a fourth embodiment according to the present invention.

A fourth embodiment according to the present invention is shown in FIG. 6, in which the scanning electrode array 3 is formed horizontally and the data electrode array 2 is formed vertically as in a usual EL matrix display device. In this arrangement, there is a problem that luminance unevenness is caused on the display panel due to uneven wiring resistances among the scanning electrodes. To reduce the uneven wiring resistances, the first wiring lead portion 3b (extending from a scanning electrode 3a which is in the display region A) of each scanning electrode 3 of the present embodiment is formed so that it extends to the right side or to the left side alternately one by one to make available a wider space for each first wiring lead portion 3b. The first wiring lead portion 3b is made wider than the second wiring lead portion 3c. Thus, an overall wiring resistance for each scanning electrode can be made smaller and accordingly wiring resistance differences among the scanning electrodes can be made smaller, too. This helps improve the luminance unevenness.

Figure 7:
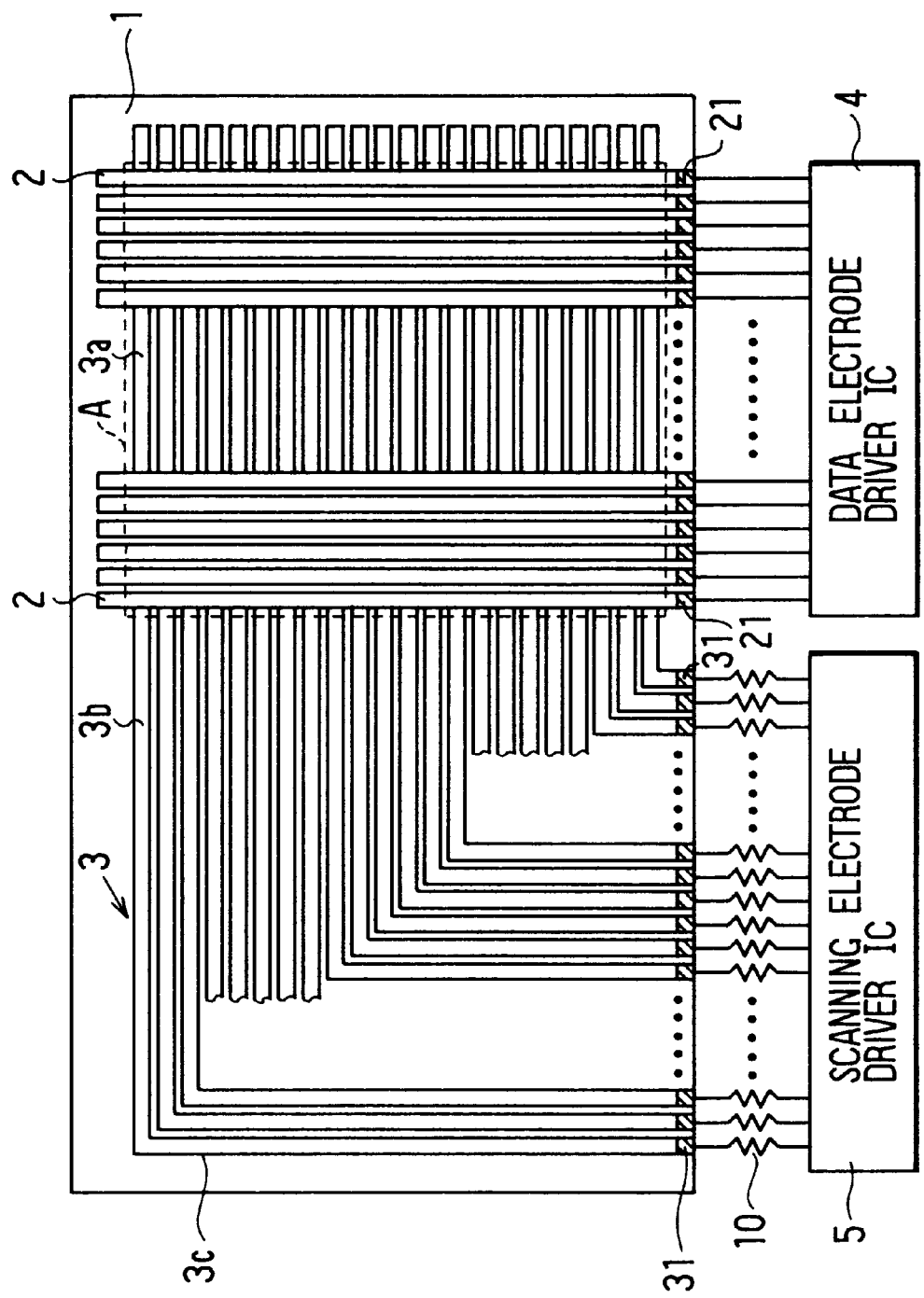
FIG. 7 shows a main structure of an EL display device as a fifth embodiment according to the present invention.

A fifth embodiment according to the present invention is shown in FIG. 7. The structure of this embodiment is similar to the fourth embodiment described above except for the wiring lead portions 3b and 3c which are all formed on one side (left side) of the substrate 1. Because the length of wiring lead portions 3b and 3c differ from one another in this arrangement, a compensating resistor 10 is connected to each scanning electrode to make an overall wiring resistance equal for all scanning electrodes in the same manner as in the third embodiment shown in FIG. 4. Thus, luminance unevenness caused by the different wiring resistances of the scanning electrodes can be much improved.

Figure 8:
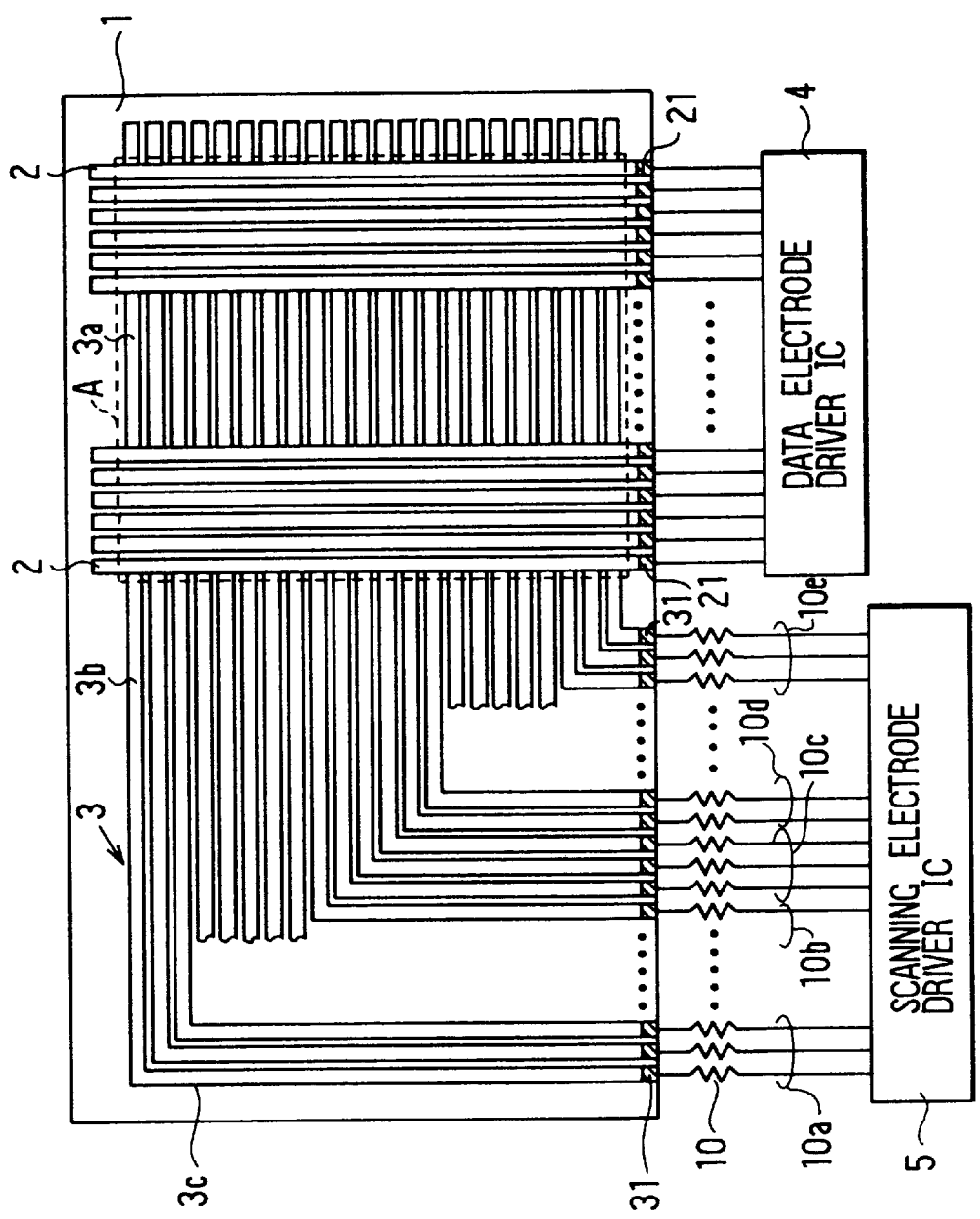
FIG. 8 shows a modified form of the fifth embodiment.

A modification of the fifth embodiment is shown in FIG. 8, in which the compensating resistors 10 of the fifth embodiment are grouped into a certain number of groups in the same manner as in the modification of the third embodiment shown in FIG. 5. In a particular form shown in FIG. 8, the compensating resistors 10 are grouped into groups 10a, 10b, . . . 10e, each group including three compensating resistors 10 therein. The values of the compensating resistors are selected in the same manner as in the modification of the third embodiment mentioned above.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An electroluminescent matrix display device comprising:
   a transparent substrate having a rectangular shape, and having two opposing planar surfaces and a plurality of lateral side surfaces abutting a plurality of respective edge portions of each of said opposing planar surfaces;
   a data electrode array including a plurality of transparent data electrodes formed on the substrate;
   a scanning electrode array including a plurality of transparent scanning electrodes formed on the substrate, with insulating layers and a luminescent layer interposed between the data electrode array and the scanning electrode array, the scanning electrode array being perpendicular to the data electrode array, said scanning electrode array and said data electrode array together forming a matrix display region;
   data electrode terminals formed along one edge portion of the rectangular substrate and connected to a data electrode driver circuit;
   wiring lead portions connecting the data electrodes to the electrodes terminals; and
   scanning electrode terminals formed along the same one edge portion of the rectangular substrate as the data electrode terminals and connected to a scanning electrode driver circuit, the scanning electrodes being connected directly to the scanning electrode terminals.

2. An electroluminescent matrix display device according to claim 1, wherein the data electrodes are divided into an upper half group and a lower half group, and wherein the upper half group is connected to the data electrode terminals through the wiring lead portions formed at one of a right portion and a left portion of the rectangular substrate and the lower-half group is connected to the data electrode terminals through the wiring lead portions formed at another of the right portion and the left portion of the rectangular substrate.

3. An electroluminescent matrix display device according to claim 1, wherein the data electrodes are alternately one by one connected to respective data electrode terminals, through respective wiring lead portions formed at right and left portions of the rectangular substrate.

4. An electroluminescent matrix display device according to claim 3, wherein each wiring lead portion for connecting the data electrode to the data electrode terminal comprises a first lead portion extending horizontally and a second lead portion extending perpendicularly to the first lead portion, and wherein the first lead portion is wider than the second lead portion.

5. An electroluminescent matrix display device according to claim 1, further comprising compensating resistors for equalizing a total wiring resistance of each wiring lead portion, the compensating resistors being connected between the data electrode terminals and the data electrode driver circuit.

6. An electroluminescent matrix display device according to claim 5, wherein the data electrode terminals are divided into a plurality of groups, each group including a certain number of neighboring terminals, wherein the compensating resistors belonging to a given group have an equal value of resistance, and wherein the value of resistance among groups varies stepwise from group to group.

7. An electroluminescent matrix display device comprising:
- a transparent substrate having a rectangular shape, and having two opposing planar surfaces and a plurality of lateral side surfaces abutting a plurality of respective edge portions of each of said opposing planar surfaces;
- a scanning electrode array including a plurality of transparent scanning electrodes formed on the substrate;
- a data electrode array including a plurality of transparent data electrodes formed on the substrate, with insulating layers and a luminescent layer interposed between the scanning electrode array and the data electrode array, the data electrode array being perpendicular to the scanning electrode array, said data electrode array and said scanning electrode array together forming a matrix display region;
- scanning electrode terminals formed along one edge portion of the rectangular substrate and connected to a scanning electrode driver circuit;
- wiring leads connecting the scanning electrodes to the scanning electrode terminals, each wiring lead having a width so that resistance values of said wiring leads are substantially equal to one another; and
- data electrode terminals formed along the same one edge portion of the rectangular substrate as the scanning electrode terminals and connected to a data electrode driver circuit, the data electrodes being connected directly to the data electrode terminals.

8. An electroluminescent matrix display device according to claim 7, wherein the scanning electrodes are alternately one by one connected to respective data electrode terminals, through respective wiring leads formed at right and left portions of the rectangular substrate, and each wiring lead comprises a first lead extending horizontally and a second lead extending perpendicularly to the first lead, the first lead being made wider than the second lead.

9. An electroluminescent matrix display device comprising:
- a transparent substrate having a rectangular shape;
- a scanning electrode array including a plurality of transparent scanning electrodes formed on the substrate;
- a data electrode array including a plurality of transparent data electrodes formed on the substrate, with insulating layers and a luminescent layer interposed between the scanning electrode array and the data electrode array, the data electrode array being perpendicular to the scanning electrode array, the scanning electrode array and the data electrode array together forming a matrix display region;
- scanning electrode terminals formed on one side of the rectangular substrate and connected to a scanning electrode driver circuit;
- wiring leads connecting the scanning electrodes to the scanning electrode terminals;
- data electrode terminals formed on the same side of the rectangular substrate as the scanning electrode terminals and connected to a data electrode driver circuit, the data electrodes being connected directly to the data electrode terminals; and
- compensating resistors, for equalizing a total wiring resistance of each wiring lead, connected between the scanning electrode terminals and the scanning electrode driver circuit.

10. An electroluminescent matrix display device according to claim 9, wherein the scanning electrode terminals are divided into a plurality of groups, each group including a certain number of neighboring terminals, wherein the compensating resistor, belonging to a given group have an equal value of resistance and wherein the value of resistance among groups varies stepwise from group to group.

11. An electroluminescent matrix display device comprising:
- a transparent substrate having two opposing planar surfaces and a plurality of lateral side surfaces abutting respective edge portions of each of said opposing planar surfaces;
- a scanning electrode array including a plurality of transparent scanning electrodes formed on the substrate;
- a set of layers comprising insulating layers and a luminescent layer interposed between said electrode array and said scanning electrode array;
- said scanning electrode array being perpendicular to said data electrode array;
- data electrode terminals formed along one edge portion of said transparent substrate and connected to a data electrode driver circuit; and
- scanning electrode terminals formed along the same one edge portion of said transparent substrate as the data electrode terminals and connected to a scanning electrode driver circuit.

12. The display device according to claim 11, wherein said transparent substrate is rectangular in shape.

* * * * *